United States Patent
Xu

(10) Patent No.: US 10,304,711 B2
(45) Date of Patent: May 28, 2019

(54) CASSETTE AND SUBSTRATE TRANSFER DEVICE

(71) Applicants: BOE Technology Group Co., Ltd., Beijing (CN); Hefei Xinsheng Optoelectronics Technology Co., Ltd., Anhui (CN)

(72) Inventor: Min Xu, Beijing (CN)

(73) Assignees: BOE Technology Group Co., Ltd., Beijing (CN); Hefei Xinsheng Optoelectronics Technology Co., Ltd., Hefei (CN)

( * ) Notice: Subject to any disclaimer, the term of this patent is extended or adjusted under 35 U.S.C. 154(b) by 211 days.

(21) Appl. No.: 15/092,095

(22) Filed: Apr. 6, 2016

(65) Prior Publication Data

US 2016/0300740 A1    Oct. 13, 2016

(30) Foreign Application Priority Data

Apr. 7, 2015 (CN) .......................... 2015 1 0160948

(51) Int. Cl.
*H01L 21/673* (2006.01)
*H01L 21/677* (2006.01)
*H01L 21/67* (2006.01)

(52) U.S. Cl.
CPC .... *H01L 21/67709* (2013.01); *H01L 21/6734* (2013.01); *H01L 21/67259* (2013.01); *H01L 21/67303* (2013.01)

(58) Field of Classification Search
CPC ............... B65D 85/48; H01L 21/6734; H01L 21/67259; H01L 21/67303; H01L 21/67709

USPC ........................................... 211/41.18, 41.14
See application file for complete search history.

(56) References Cited

FOREIGN PATENT DOCUMENTS

| CN | 2716866 Y | 8/2005 |
|---|---|---|
| CN | 101112933 A | 1/2008 |
| CN | 201247360 Y | 5/2009 |
| CN | 101992901 A | 3/2011 |
| CN | 103183182 A | 7/2013 |
| KR | 1020130062837 A | 6/2013 |

OTHER PUBLICATIONS

Machine translation of CN 2716866, from worldwide.espacenet.com. (Year: 2005).*

(Continued)

*Primary Examiner* — Mark C Hageman
(74) *Attorney, Agent, or Firm* — Banner & Witcoff, Ltd.

(57) ABSTRACT

A cassette and a substrate transfer device are disclosed. The cassette includes a first frame and at least one movable face. The first frame includes at least one set of first guide rails; and the movable face is disposed in the first frame. The movable face is configured to be capable of being driven to slide along the first guide rails, and is configured to be capable of being fixed on the first frame. The substrate transfer device includes the cassette provided by one of the embodiments of the disclosure and a bearing device configured to bear the cassette, the bearing device comprises a second frame and a rotating unit mounted in the second frame. The movable face of the cassette can be firmly fixed on the first frame and can move freely to change size of sub-cassettes.

17 Claims, 7 Drawing Sheets

(56) References Cited

OTHER PUBLICATIONS

Machine translation of CN 10383182 from worldwide.espacenet.com. (Year: 2013).*
Machine translation of CN 201247360, from worldwide.espacenet.com. (Year: 2009).*
Electromagnetic backlash-free linear brake, from http://www.controlsdrivesautomation.com/page.asp?obj_id=396310&print=1.(Year: 2014).*
Mar. 3, 2017—(CN) First Office Action Appn 201510160948.8 with English Tran.

* cited by examiner

CASSETTE AND SUBSTRATE TRANSFER DEVICE

This application claims priority to and the benefit of Chinese Patent Application No. 201510160948.8 filed on Apr. 7, 2015, which application is incorporated herein in its entirety.

TECHNICAL FIELD

At least one embodiment of the present disclosure relates to a cassette and a substrate transfer device.

BACKGROUND

In a manufacturing process of a liquid crystal panel, a substrate where a process at a previous stage is completed needs to be transferred to a process at a next stage by a cassette. Generally, a size of a glass substrate is fixed in a specific process, and at the moment, a size of the cassette for transferring the substrate is also fixed. However, in actual production, according to market requirements, display panels with different sizes will be produced and liquid crystal panels with different sizes need to be cut to. In order to transfer the liquid crystal panels to the next process, cassettes with different sizes need to be prepared, which will occupy more space, increase production cost and reduce production efficiency.

SUMMARY

At least one embodiment of the present disclosure provides a cassette and a substrate transfer device.

At least one embodiment of the present disclosure provides a cassette comprising: a first frame comprising at least one set of first guide rails; and at least one movable face disposed in the first frame, wherein the movable face is configured to be capable of being driven to slide along the first guide rails, and is configured to be capable of being fixed on the first frame.

For example, according to the cassette provided by one embodiment of the present disclosure, the first frame comprises two sets of first guide rails, the two sets of first guide rails are parallel to each other and are respectively disposed on two opposite surfaces of the first frame, a first driving rod is disposed in each of the first guide rails in an extending direction of the first guide rails.

For example, according to the cassette provided by one embodiment of the present disclosure, the first frame is a parallelepiped frame, the two sets of first guide rails are disposed at four sides parallel to each other of the first frame.

For example, according to the cassette provided by one embodiment of the present disclosure, the movable face is disposed in the first frame and is connected with the two sets of first guide rails and perpendicular to an extending direction of the first guide rails; and a sliding rod is disposed on the movable face along its side crossed with and perpendicular to the first guide rails; and a first sliding member capable of being nested on the first driving rod is disposed on the sliding rod.

For example, according to the cassette provided by one embodiment of the present disclosure, the first sliding member is connected with the first driving rod by screw threads.

For example, according to the cassette provided by one embodiment of the present disclosure, the first sliding member and one of the first guide rails are magnetically adsorbed, and during desorption, the first sliding member drives the sliding rod and the sliding rod drives the movable face to move, so that inside of the first frame is divided into sub-cassettes with different sizes.

For example, according to the cassette provided by one embodiment of the present disclosure, the first sliding member and the first guide rails are made of sucker type de-energized electromagnet.

For example, according to the cassette provided by one embodiment of the present disclosure, the first frame comprises a face opposite to the movable face and first support rods disposed on the face opposite to the movable face, and the first support rods are perpendicular to the face opposite to the movable face and point to the inside of the first frame.

For example, according to the cassette provided by one embodiment of the present disclosure, second support rods are disposed on the movable face, and the second support rods are parallel to the first support rods and point to the face opposite to the movable face.

For example, according to the cassette provided by one embodiment of the present disclosure, a movable connecting rod is disposed on the movable face, the second support rods are disposed on the movable connecting rod, and the movable connecting rod is configured to drive the second support rods to move.

For example, according to the cassette provided by one embodiment of the present disclosure, a support pillar with via holes is disposed on the movable face, the movable connecting rod is disposed on the support pillar, and the via holes are opposite to the first support rods.

For example, according to the cassette provided by one embodiment of the present disclosure, a first laser distance measuring device configured to measure a moving distance of the movable face is disposed on at least one of the first frame and the movable face.

For example, according to the cassette provided by one embodiment of the present disclosure, a supporting leg configured to mount a first chip is disposed at a bottom of the cassette.

At least one embodiment of the present disclosure provides a substrate transfer device comprising the cassette according to at least one of the embodiments of the present disclosure and a bearing device configured to bear the cassette, wherein the bearing device comprises a second frame and a rotating unit mounted in the second frame, and the rotating unit comprises a rotating member, and a rotating axis which is disposed at a center of the rotating member and is configured to drive the rotating member to rotate.

For example, according to the substrate transfer device provided by one embodiment of the present disclosure, a supporting leg configured to mount a first chip is disposed at a bottom of the cassette, and the rotating unit further comprises a connecting member which is disposed on the rotating member and is configured to be nested with the supporting leg of the cassette.

For example, according to the substrate transfer device provided by one embodiment of the present disclosure, a second chip is disposed in the connecting member.

For example, according to the substrate transfer device provided by one embodiment of the present disclosure, a base configured to mount the rotating unit is disposed at a bottom of the second frame, a second guide rail is disposed on the base, and a second driving rod is disposed in the second guide rail in an extending direction of the second guide rail; and a second sliding member matched with the second driving rod is disposed at a bottom of the rotating member, and the second sliding member is configured to be capable of sliding on the second driving rod to drive the rotating member to slide along the second guide rail.

For example, according to the substrate transfer device provided by one embodiment of the present disclosure, the second sliding member and the second guide rail are made of sucker type de-energized electromagnet.

For example, according to the substrate transfer device provided by one embodiment of the present disclosure, a second laser distance measuring device configured to measure a distance between the second frame and the rotating unit is disposed on at least one of the second frame and the rotating unit.

For example, according to the substrate transfer device provided by one embodiment of the present disclosure, the second frame is a parallelepiped frame.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

REFERENCE NUMERALS

Figure 1:
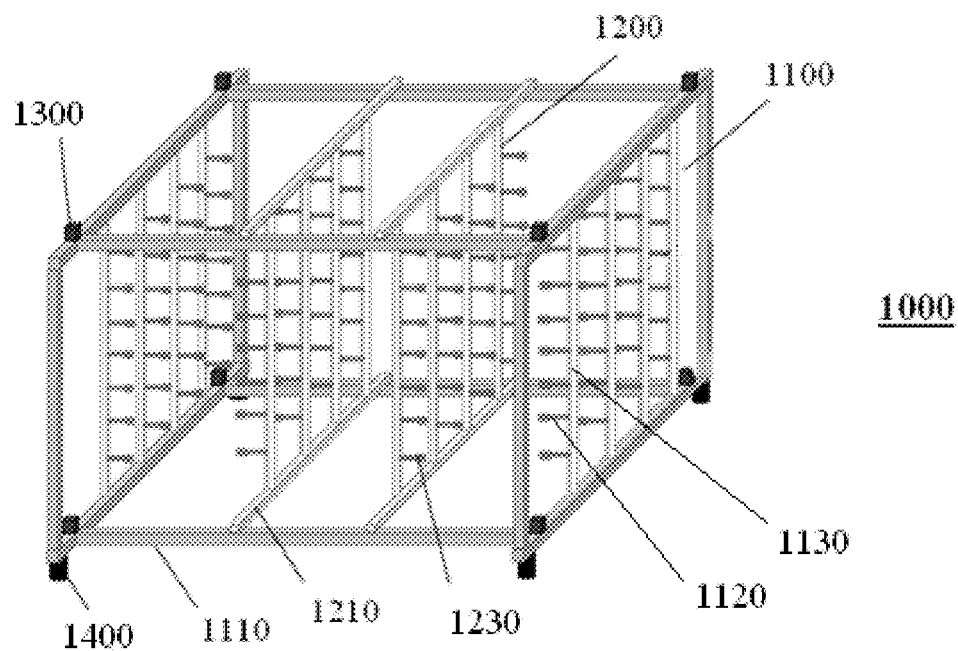
FIG. 1 is a stereoscopic schematic diagram of a cassette according to one embodiment of the present disclosure.

1000—cassette; 1100—first frame; 1110—first guide rail; 1111—first driving rod; 1112—first drive; 1120—first support rod; 1130—fixing support pillar; 1200—movable face; 1210—sliding rod; 1220—first sliding member; 1230—second support rod; 1240—movable connecting rod; 1250—support pillar; 1251—via hole; 1260—second drive; 1300—first laser distance measuring device; 1310—optical sensor; 1400—supporting leg; 1500—first sub-cassette; 1510—first sub-cassette center line; 1600—second sub-cassette; 1610—second sub-cassette center line; 2000—bearing device; 2100—second frame; 2200—rotating unit; 2210—rotating member; 2211—connecting member; 2212—second sliding member; 2220—rotating axis; 2300—base; 2310—second guide rail; 2320—second driving rod; 2330—fourth drive; 2400—second laser distance measuring device; 3000—operation interface; 4000—substrate placing center line for a mechanical arm.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Commonly, a method for solving the aforesaid problem is to design different types of adjustable cassettes. However, a usual adjustable cassette adopts a manual adjusting method, only one sub-cassette is formed after adjustment, the cassette is manually adjusted only by a preset adjustment point, and the cassette is fixed by a clamping groove, and is not firmly fixed. Therefore, a usual technique has at least one of the problems as follows: (1), the sub-cassette formed after adjustment cannot be firmly fixed; (2), adjustment accuracy of the sub-cassette is difficult to determine; (3), the cassette cannot automatically rotate, and thus, a space of the sub-cassette cannot be sufficiently utilized; and (4), the cassette cannot automatically move and a moving distance of the cassette cannot be accurately measured, so that accuracy of placing substrates is influenced.

As illustrated in FIG. 1, one embodiment of the present disclosure provides a cassette. The cassette comprises: a first frame 1100 and at least one movable face 1200. The first frame 1100 includes at least one set of first guide rails 1110, the movable face 1200 is disposed in the first frame 1100 and is configured to be capable of being driven to slide along the first guide rails 1110, and the movable face 1200 is configured to be capable of being fixed on the first frame 1100. For example, one set of first guide rails include two first guide rails.

For example, the movable face 1200 can be a board, or a grid or railing like element, for example, the grid or railing like element may be formed by rods.

According to the cassette provided by the embodiment, different sizes of sub-cassettes can be obtained by moving the movable faces.

Figure 2:
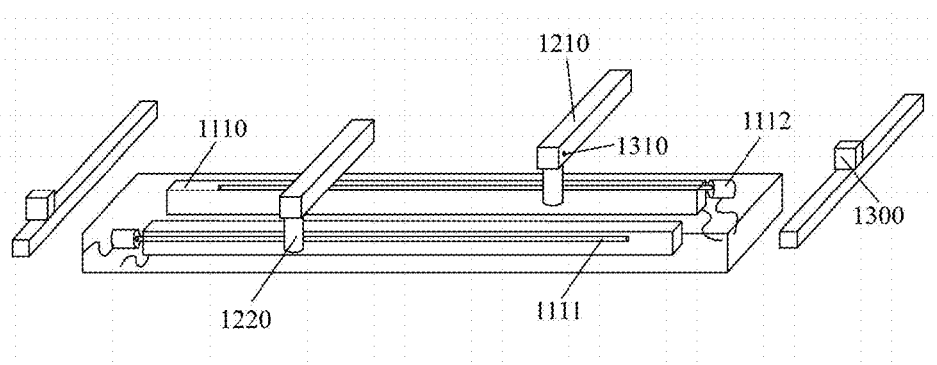
FIG. 2 is a schematic diagram of a moving principle of a movable face.

FIG. 2 illustrates a moving principle of a movable face of a cassette 1000 provided by one embodiment of the present disclosure. In conjunction with FIG. 1, it can be seen that the cassette 1000 comprises a first frame 1100, and the first frame 1100 can be a cuboid or a cube. The first frame 1100 includes two sets of first guide rails 1110, the two sets of first guide rails 1110 are parallel to each other and are respectively disposed on two opposite surfaces of the first frame 1100. For example, the first frame is a parallelepiped frame, the two sets of first guide rails are disposed at four sides parallel to each other of the first frame. For example, one set of first guide rails are disposed on a bottom surface of the first frame 1100, and the other set of first guide rails are disposed on a top surface of the first frame 1100. A first driving rod 1111 is disposed in each of the first guide rails 1110 in an extending direction of the first guide rails. The cassette 1000 further comprises at least one movable face 1200, and the movable face 1200 can be of a rectangular or square shape. The movable face 1200 is disposed in the first frame 1100 and is connected with the two sets of first guide rails 1110 and perpendicular to an extending direction of the first guide rails. For example, a movable face 1200 can be a face parallel to a left side surface or a right side surface of the first frame 1100, in the first frame 1100. For example, two movable faces 1200 are illustrated in FIG. 1, and each of the movable faces 1200 are perpendicular to the two sets of first guide rails 1110.

As illustrated in FIG. 1, a sliding rod 1210 is disposed on the movable face 1200 along its side crossed with and perpendicular to the first guide rails 1110. As illustrated in FIG. 2, a first sliding member 1220 capable of being nested on the first driving rod 1111 is disposed on the sliding rod 1210. For example, the movable face is configured to be capable of being fixed on the first frame by magnetism. For example, the first sliding member 1220 and one of the first guide rails 1110 are magnetically adsorbed, and during desorption, the first sliding member 1220 drives the sliding rod 1210 and the sliding rod 1210 drives the movable face 1200 to move, so that inside of the first frame 1100 can be divided into sub-cassettes with different sizes.

For example, two movable faces in FIG. 1 can divide the inside of the first frame 1100 into two sub-cassettes. It should be illustrated that the number of the movable faces is not limited to the drawings.

According to at least one embodiment of the present disclosure, sizes of the sub-cassettes can be adjusted, according to sizes of substrates, by moving the movable face(s) 1200 in the first frame 1100 of the cassette 1000. For example, the first sliding member 1220 can slide on the first guide rail 1110 so as to drive the sliding rod 1210 to slide, and sliding of the sliding rod 1210 also drives the whole movable face 1200 to slide so as to enable the movable face 1200 to move with respect to a face, which is parallel and opposite to the movable face 1200, in the first frame 1100, thereby changing sizes of sub-cassettes. For example, as illustrated in FIG. 1, the size of the sub-cassette on the left side can be adjusted by moving the movable face 1200 on the left side leftwards or rightwards, the size of the sub-cassette on the right side can be adjusted by moving the movable face 1200 on the right side leftwards or rightwards. In addition, the first sliding member 1220 and the first guide rail 1110 are magnetically adsorbed; and the first sliding member 1220 and the first guide rail 1110 can be respectively made of magnetic materials, or contact portions of the first sliding member 1220 and the first guide rail 1110 can be made of magnetic materials, which are not limited herein. The sizes of the sub-cassettes can be adjusted according to sizes of glass substrates which need to be loaded in production. For example, both the cassette and the sub-cassettes can have a characteristic of a left-and-right and front-and-back symmetrical structure with respect to center lines.

According to one embodiment of the present disclosure, the first sliding members 1220 and the first guide rails 1110 are made of sucker type de-energized electromagnet. For example, a bottom of the first sliding members 1220 and a bottom of the first guide rails 1110 are made of sucker type de-energized electromagnet, and the magnetic materials are nonmagnetic when being powered on, and are magnetic when being powered off. When the sizes of the sub-cassettes need to be changed, the first sliding members 1220 and the first guide rails 1110 are powered on, the first sliding members 1220 and the first guide rails 1110 are in a free state after being powered on, the first sliding members 1220 can move on the first driving rods 1111 to drive the sliding rods 1210 to move, the sliding rods 1210 drive the movable face(s) 1200 to move, a power-off operation is performed after the sub-cassettes with desired sizes are formed, and then magnetism is generated between the first sliding members 1220 and the first guide rails 1110, so that the first guide rails 1110 and the first sliding members 1220 are fixed by magnetism to prevent fragmentation of the loaded glass substrates, which is caused by movement of the movable face(s) 1200 when the substrates are loaded, and thus, movement of the movable face(s) 1200 can be adjusted by controlling the power-on and power-off operations to realize automatic control.

For example, the sucker type de-energized electromagnet can select from CPH-series of sucker type de-energized electromagnets, and adopts a working mode opposite to that of a CEH sucker type electromagnets, that is, a powerful holding force is generated in a de-energized state by built-in permanent magnets with a super strong attractive force. In a power-on state, a magnetic force generated by an applied direct current is opposite to an inherent magnetic force of the built-in permanent magnets in polarity, so that the attractive forces are balanced out mutually to enable the electromagnets not to generate a holding force.

According to the cassette provided by the embodiment, the movable face 1200 and the first frame 1100 are fixed by magnetism, and thus, the movable face after being adjusted can be firmly fixed on the first frame and breakage of glass substrates cannot be caused by movement generated due to unfirm fixation of the movable face.

Figure 3:
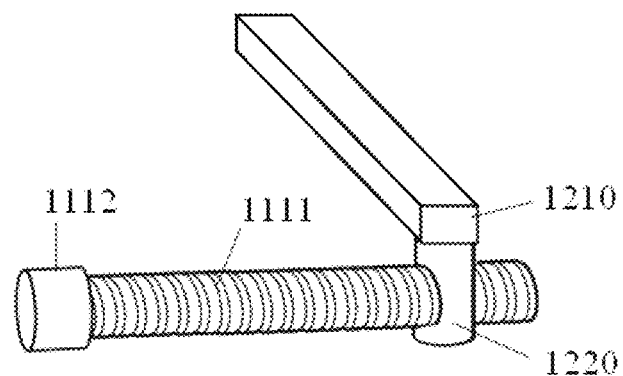
FIG. 3 is a schematic diagram of a moving principle of a first sliding member on a first driving rod.
Figure 4:
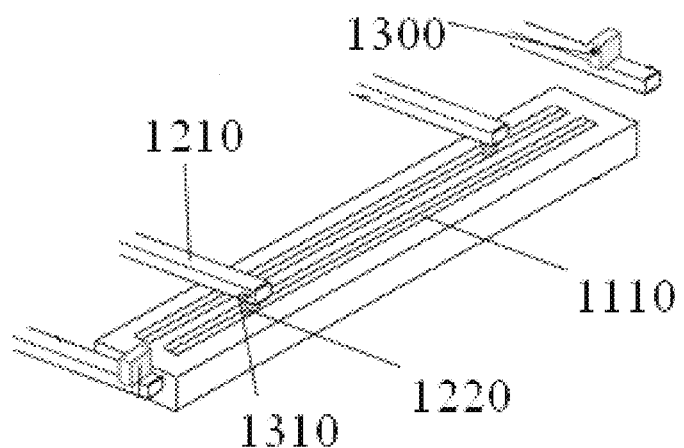
FIG. 4 is a schematic diagram of a moving principle of a sliding rod on a first guide rail.

According to one embodiment of the present disclosure, the first sliding member 1220 is connected with the first driving rod 1111 by screw threads. As illustrated in FIG. 3, the first sliding member 1220 is nested on the first driving rod 1111 and is connected with the first driving rod 1111 by matched screw threads. According to one embodiment of the present disclosure as illustrated in FIG. 2, it can be seen that a first drive 1112 is connected with one first driving rod 1111 and can drive the first driving rod 1111. In conjunction with FIG. 2 and FIG. 3, it can be seen that a rotating direction of the first driving rod 1111 can change a moving direction of the first sliding member(s) 1220 on the first driving rod 1111, and by controlling forward rotation and reverse rotation of the first drive 1112, rotation of the first sliding member(s) 1220 along the first driving rod 1111 towards an opposite direction is achieved so as to control a moving direction of a movable face 1200 and achieve adjustment on sizes of sub-cassettes. According to FIG. 4, a moving principle of a sliding rod 1210 on the first guide rail 1110 also can be seen.

According to one embodiment of the present disclosure, the first frame 1100 comprises a face opposite to the movable face 1200 and first support rods 1120 disposed on the face opposite to the movable face, and the first support rods 1120 are perpendicular to the face opposite to the movable face and point to the inside of the first frame 1100.

According to one embodiment of the present disclosure as illustrated in FIG. 1, fixing support pillars 1130 can be disposed on both left and right opposed faces of the first frame 1100, both ends of a fixing support pillar 1130 are respectively fixed on side beams of the first frame 1100, first support rods 1120 perpendicular to the fixing support pillar 1130 are disposed on each fixing support pillar 1130, the first support rods 1120 match with the second support rods 1230 disposed on the movable face 1200 for placing substrates, or the first support rods 1120 on two opposed faces match for placing substrates. In addition, the fixing support pillar(s) 1130 may not be disposed on both the opposed faces of the first frame 1100, but one face where the first support rods 1120 can be disposed is selected, via holes are formed on the selected face, and the second support rods 1230 on a movable face 1200 are enabled to pass through the via holes, so that the largest utilization space can be obtained.

According to one embodiment of the present disclosure, second support rods 1230 are disposed on a movable face 1200, and the second support rods 1230 are parallel to the first support rods and point to the face opposite to the movable face. For example, the second support rods 1230 are horizontally opposite to the first support rods 1120 for placing the substrates.

For example, the face opposite to the movable face may be a board, or a grid or railing like element, for example, the grid or railing like element may be formed by rods.

According to one embodiment of the present disclosure, as illustrated in FIG. 1, second support rods 1230 are respectively disposed on both surfaces of a movable face 1200, and the second support rods 1230 are parallel to the first support rods and point to the face opposite to the movable face. For example, the second support rods 1230 are all horizontally opposite to the first support rods 1120 disposed on the faces opposite to the second support rods 1230 for placing glass substrates. The space sizes of sub-cassettes are changed by moving the movable face(s) 1200 for bearing substrates with different sizes. Left, middle and right total three sub-cassettes can be formed in a case that the second support rods 1230 are respectively disposed on both faces of both of the two movable faces 1200 in FIG. 1.

Figure 5:
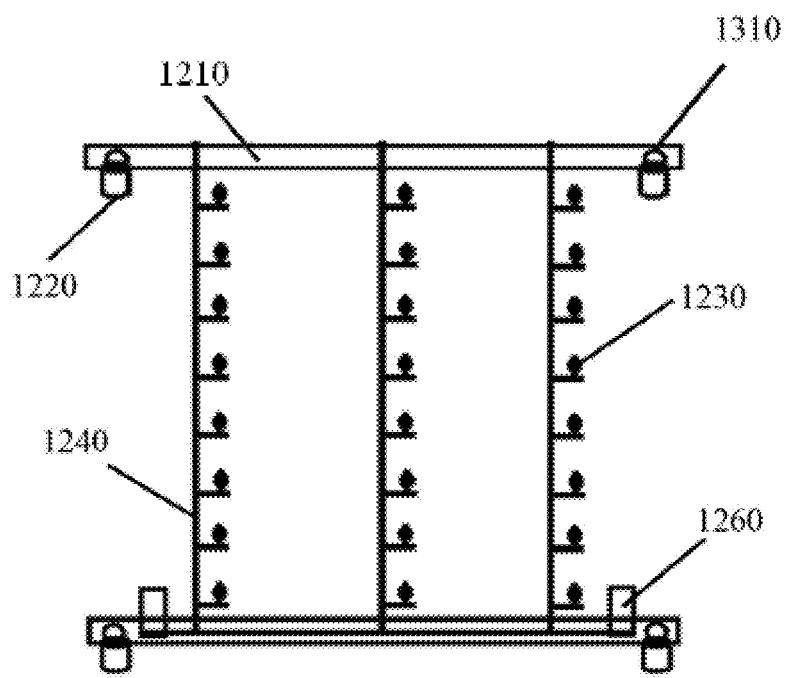
FIG. 5 is a schematic diagram of a movable face according to one embodiment of the present disclosure.

According to one embodiment of the present disclosure, as illustrated in FIG. 5, movable connecting rods 1240 are disposed on a movable face 1200, the second support rods 1230 are disposed on the movable connecting rods 1240, and the movable connecting rods 1240 drive the second support rods 1230 to move.

According to one movable face of the cassette provided by one embodiment of the present disclosure as illustrated in FIG. 5, it can be seen that the movable face 1200 includes upper and lower sliding rods 1210 and movable connecting rods 1240 disposed between the upper and lower sliding rods 1210, the first sliding members 1220 are disposed on the sliding rods 1210, and second drives 1260 are connected with the movable connecting rods 1240 and can drive the movable connecting rods 1240 to move in a direction perpendicular to the sliding rods 1210 so as to drive the second support rods 1230 to move. Therefore, when the movable face 1200 moves to be closest to a corresponding opposed face, the movable connecting rods 1240 ascend or descend, and the first support rods 1120 can pass through the movable face 1200, thereby saving a space to a maximum degree. For example, the upper ends of the movable connecting rods 1240 can be movably connected with the sliding rods 1210, small holes are disposed on the sliding rods 1210, the movable connecting rods 1240 can pass through the small holes on the sliding rods 1210 and move up and down, and when the second support rods 1230 need to move up and down, the movable connecting rods 1240 can move up and down through the small holes on the sliding rods 1210. Therefore, the problem that when size of substrates to be loaded are close to size of the cassette, the movable face 1200 needs to be moved to be close to one surface of the first frame 1100 so as to maximize a middle region of the cassette can be solved. For example, the movable connecting rods 1240 on the movable face and the fixing support pillars 1130 on the first frame can be staggered in position; and a connector is disposed between each of the second support rods 1230 and the corresponding movable connecting rod 1240 to connect the second support rods 1230 and the movable connecting rod 1240, the first support rods 1120 are horizontally opposite to the second support rods 1230, and after the movable connecting rods 1240 drive the second support rods 1230 to ascend or descend, the first support rods 1120 pass through the movable face 1200.

Figure 6:
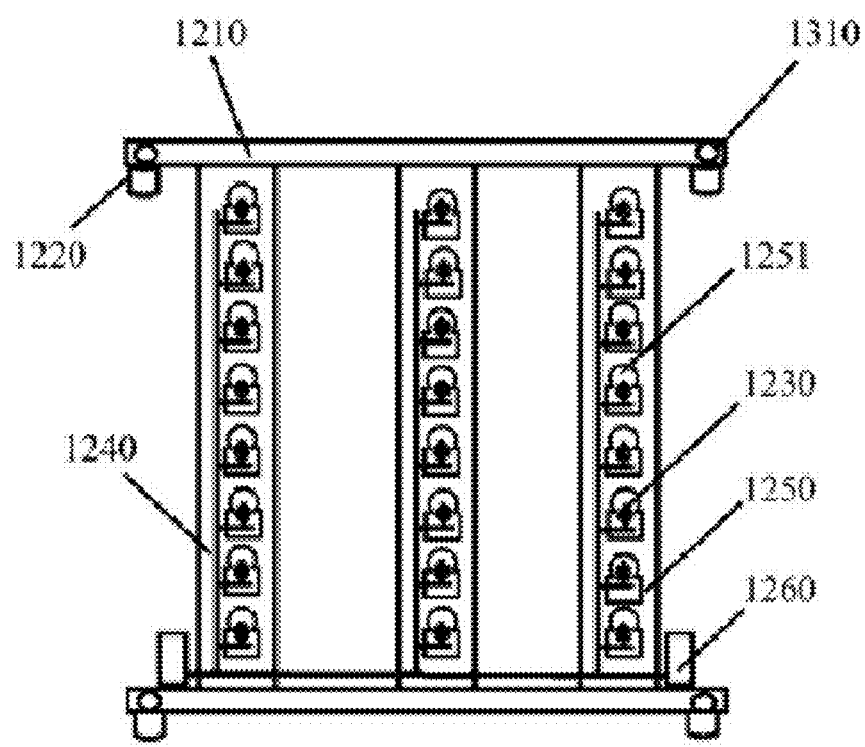
FIG. 6 is a schematic diagram of a movable face according to one embodiment of the present disclosure.

According to one embodiment of the present disclosure, as illustrated in FIG. 6, support pillars 1250 with via holes 1251 are disposed on the movable face 1200, the movable connecting rods 1240 are disposed on the support pillars 1250, and the via holes 1251 are for example horizontally opposite to the first support rods 1120. In the embodiment, when glass substrates need to be placed, the movable connecting rods 1240 ascend or descend to drive the second support rods 1230 to move to the positions of the via holes 1251, so that the second support rods 1230 and the first support rods 1120 are positioned at the same horizontal position, thereby the aim of supporting glass substrates is fulfilled. When the movable faces 1200 need to be moved to both sides of the cassette to be put away, the movable connecting rods 1240 need to ascend or descend, and the via holes 1251 are exposed, so that the first support rods 1120 can pass through the via holes 1251. The embodiment can also solve the problem that when sizes of substrates to be loaded are close to size of the cassette, the movable face 1200 needs to move to be close to one surface of the first frame 1100 so as to maximize the middle region of a cassette.

According to one embodiment of the present disclosure, a first laser distance measuring device 1300 is disposed on at least one of the first frame 1100 and the movable face 1200. As illustrated in FIG. 1, when the first guide rails 1110 are mounted on beams of the first frame 1100 and lengths of the first guide rails 1110 are consistent with those of the beams, the first laser distance measuring devices 1300 can be disposed at both ends of the first guide rails 1110. In addition, further, optical sensors 1310 (as illustrated in FIG. 2) can be disposed at side ends of the sliding rod 1210. And furthermore, when the optical sensors 1310 are disposed at the side ends of the sliding rods 1210, the optical sensors 1310 are disposed on side surfaces of the first laser distance measuring device for accurately controlling a distance between the first frame and the movable face, so as to fulfill the aim of accurately adjusting size of the sub-cassettes.

Figure 7:
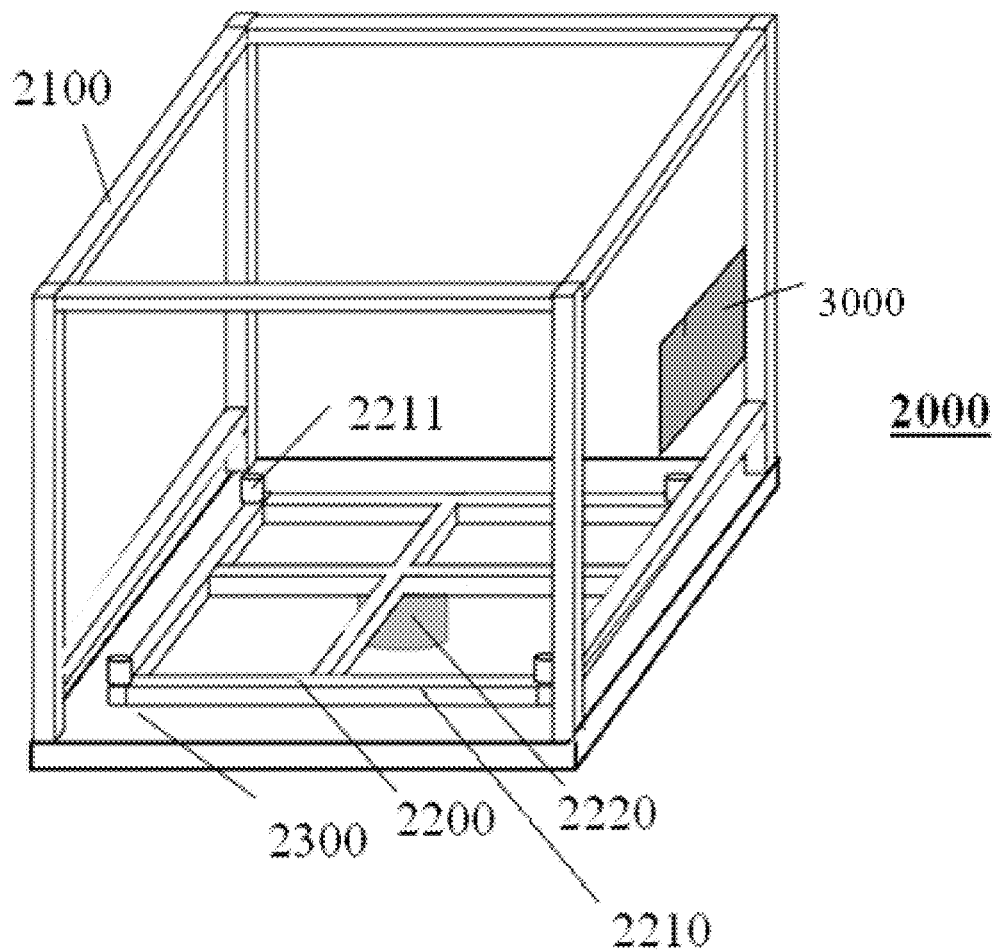
FIG. 7 is a schematic diagram of a cassette bearing device according to one embodiment of the present disclosure.

According to one embodiment of the present disclosure, as illustrated in FIG. 1, supporting legs 1400 configured to mount first chips are disposed at a bottom of the cassette 1000. The first chips are disposed on the cassette 1000, for example, the first chips can be disposed in the supporting legs 1400, and also can be disposed at other positions. The first chips are connected with an operation interface 3000 (as illustrated in FIG. 7); and by setting parameters, such as moving distances of a movable face, power-on time and power-off time, on the operation interface 3000, an accurate moving distance of a movable face is controlled so as to achieve automatic control.

According to one embodiment of the present disclosure, at least one movable face 1200 can be disposed in the first frame 1100, at least one includes one and more than one, and when two movable faces 1200 are disposed in the first frame 1100, the cassette 1000 can realize the following cases in a substrate loading process:

(1) When widths of substrates are smaller than a width of a cassette and are greater than half the width of the cassette, two movable faces 1200 can be moved to both sides of the first frame 1100, and after widths of sub-cassettes are adjusted to meet the width requirement of glass substrates by controlling magnetism of the first guide rails 1110 and the first sliding members 1220, the sub-cassettes are fixed, so that glass substrates with corresponding sizes can be loaded.

(2) When widths of substrates are smaller than half the width of a cassette, two movable faces 1200 are respectively moved towards both sides, and the widths of the sub-cassettes on both sides are set to be suitable for loading glass substrates.

Two sub-cassettes capable of loading glass substrates are formed in one cassette, after the sub-cassette on the right side is fully loaded with glass substrates, the cassette is integrally moved rightwards by a suitable distance and then glass substrates are loaded in the sub-cassette on the left side, and conversely, glass substrates also can be loaded in the sub-cassette on the right side after being firstly loaded in the sub-cassette on the left side.

(3) When the widths of substrates are smaller than half the width of the cassette and lengths of substrates are smaller than half a length of the cassette, i.e., a space of each sub-cassette is only below one fourth of an integral cassette space, after the sub-cassettes on both left and right sides are fully loaded with glass substrates, the cassette can be integrally rotated by 180 degrees to form new sub-cassettes capable of loading glass substrates. The number of glass substrates loaded in one cassette can reach four times of an original number, thereby a utilization rate of a space of a cassette is greatly improved.

In the same way, a plurality of movable faces can be disposed in the first frame, sizes of sub-cassettes are adjusted according to sizes of substrates so as to enable the cassette to form different numbers of sub-cassettes, and by rotating the cassette, loading of glass substrates in sub-cassettes on other surfaces also can be achieved.

In order to achieve automatic control of rotation and/or movement of a cassette, at least one embodiment of the present disclosure provides a substrate transfer device.

One embodiment of the present disclosure provides a substrate transfer device which comprises the cassette 1000 provided by at least one embodiment of the present disclosure and a bearing device 2000 configured to bear the cassette 1000. As illustrated in FIG. 7, the bearing device 2000 includes a second frame 2100 and a rotating unit 2200 mounted in the second frame 2100. The rotating unit 2200 includes: a rotating member 2210, and a rotating axis 2220 which is disposed at a center of the rotating member 2210 and is configured to drive the rotating member 2210 to rotate. For example, the second frame is a parallelepiped frame.

According to a substrate transfer device provided by at least one embodiment of the present disclosure, the cassette bearing device 2000 can bear the cassette 1000 provided by at least one embodiment of the present disclosure, and when the cassette needs to be adjusted, the cassette can be placed in the rotating member 2210 of the rotating unit 2200 in the second frame 2100, the rotating axis 2220 is driven to rotate by a third drive (not illustrated in the diagrams) so as to drive the rotating member 2210 to rotate, the rotating member 2210 drives the cassette to rotate, and generally, when the cassette rotates by 180 degrees, the requirement can be met. The rotating axis 2220 is configured to support the rotating member 2210 so as to support the cassette on one hand, and is configured to drive the rotating member 2210 and the cassette to rotate on the other hand.

According to one embodiment of the present disclosure, as illustrated in FIG. 7, the rotating unit 2200 further includes connecting members 2211. The connecting member is disposed on the rotating member 2210 and is configured to be nested with the supporting leg of the cassette.

According to the bearing device of the substrate transfer device provided by one embodiment of the present disclosure, the connecting members 2211 can be respectively disposed on four corners of the rotating member 2210, and the connecting members 2211 match with the supporting legs of the cassette. For example, the supporting leg of the cassette can adopt a cylindrical shape, and the connecting members 2211 can select a hollow cylindrical shape matched with the supporting legs for supporting the cassette.

According to one embodiment of the present disclosure, a second chip can be disposed in the connecting member 2211. The second chips are disposed in the connecting members 2211 and can match with the first chips disposed in the supporting legs of the cassette so as to achieve transmission of electricity and signals between the cassette 1000 and the bearing device 2000, automatic operation is achieved by an operation interface 3000 so as to adjust sizes of sub-cassettes in the cassette and a rotating angle, and when the cassette 1000 and the bearing device 2000 which are provided by the embodiments of the present disclosure match for use, a rapid and high-accuracy adjusting effect can be achieved.

In the case that sizes of loaded substrates are smaller than the total width of a cassette, the loaded substrates cannot be accurately controlled to be positioned in the middle of the cassette, a position where an upstream mechanical arm inputs substrates is fixed relatively; and if the cassette does not move with respect to the mechanical arm and only positions of the movable faces in the cassette are adjusted, adjusted positions of the sub-cassettes cannot coincide with the position where an upstream mechanical arm inputs substrates, and thus, the mechanical arm cannot correctly input substrates.

In view of the case, the bearing device of the cassette needs to be designed to adopt a mode that the bearing device can move left and right and/or accurately measure a distance with respect to the upstream mechanical arm.

Figure 8:
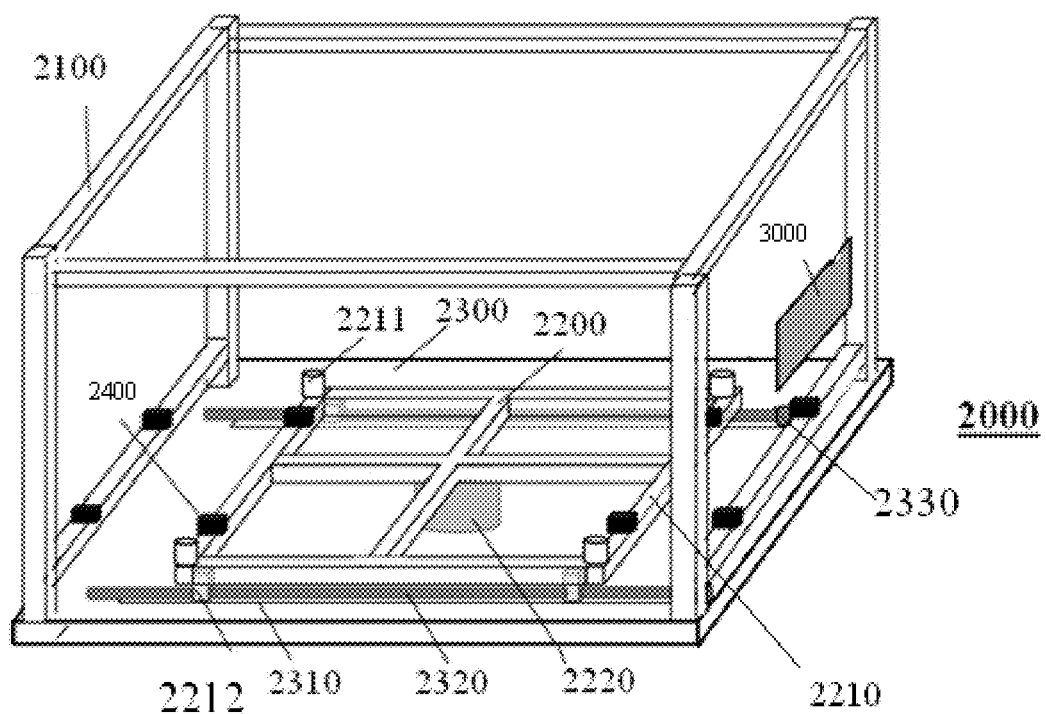
FIG. 8 is a schematic diagram of a cassette bearing device according to another embodiment of the present disclosure.

In the substrate transfer device provided by one embodiment of the present disclosure, the bearing device configured to bear the cassette can be as illustrated in FIG. 8, a base 2300 configured to mount the rotating unit 2200 is disposed at a bottom of the second frame 2100, second guide rails 2310 are disposed on the base 2300, and a second driving rod 2320 is disposed in one second guide rail 2310 in an extending direction of the second guide rail 2310; second sliding members 2212 matched with the second driving rod 2320 are disposed at a bottom of the rotating member 2210, and the second sliding member 2212 is configured to be capable of sliding on the second driving rod 2320 to drive the rotating member 2210 to slide along the second guide rails 2310.

In the substrate transfer device provided by at least one embodiment of the present disclosure, the second guide rails 2310, the second driving rods 2320 and the second sliding members 2212 are disposed on the bearing device 2000 to drive the rotating member 2210 to move left and right, and in the left-and-right moving process of the rotating member 2210, the rotating axis 2220 can move after separating from the rotating member 2210. Movement of the rotating member 2210 can adjust the center line of the cassette or center lines of the sub-cassettes to coincide with a substrate placing center line 4000 for a mechanical arm, so that glass substrates are accurately placed in the cassette or the sub-cassettes.

According to one embodiment of the present disclosure, the second sliding members 2212 and the second guide rails 2310 are made of sucker type de-energized electromagnet.

According to one embodiment of the present disclosure, the second sliding members 2212 and the second guide rails 2310 are made of sucker type de-energized electromagnet, when powered on, magnetism disappears and the second sliding members 2212 and the second guide rails 2310 are in a free state and can slide, and when powered off, the second sliding members 2212 and the second guide rails 2310 are adsorbed and fixed together, and thus, the second sliding members 2212 and the second guide rails 2310 can be controlled by power-on and power-off operations.

According to one embodiment of the present disclosure, a second laser distance measuring device is disposed on at least one of the second frame and the rotating unit to measure a distance between the second frame 2100 and the rotating unit 2200. For example, second laser distance measuring devices 2400 are disposed on both the second frame 2100 and the rotating unit 2200.

According to one embodiment of the present disclosure, the second laser distance measuring devices 2400 disposed on the second frame 2100 can be disposed at both ends of the second guide rails 2310 and on the second sliding members 2212, and a moving distance between the rotating member 2210 and the cassette 1000 is measured by measuring a distance between the second guide rail 2310 and the second sliding member 2212.

The cassette bearing device illustrated in FIG. 8 is added with the second guide rails 2310, the second driving rods 2320, the second sliding members 2212 and the second laser distance measuring device 2400 on the basis of the cassette bearing device illustrated in FIG. 7, and the rotating axis 2220 illustrated in FIG. 8 can ascend or descend with respect to the rotating member 2210. When the cassette needs to be moved left and right, magnetic adsorption between the second sliding members 2212 and the second guide rails 2310 is relieved to enable the second sliding members 2212 to be in a freely movable state, and at the same time, the rotating axis 2220 separates from the rotating member 2210, which is convenient for the rotating member 2210 to move. At the moment, a fourth drive 2330 drives the second driving rods 2320 to rotate, moving directions of the second sliding members 2212 are controlled by rotation of the second driving rods 2320, the rotating member 2210 is driven to move by movement of the second sliding members 2212, and movement of the cassette is achieved by movement of the rotating member 2210.

Figure 9:
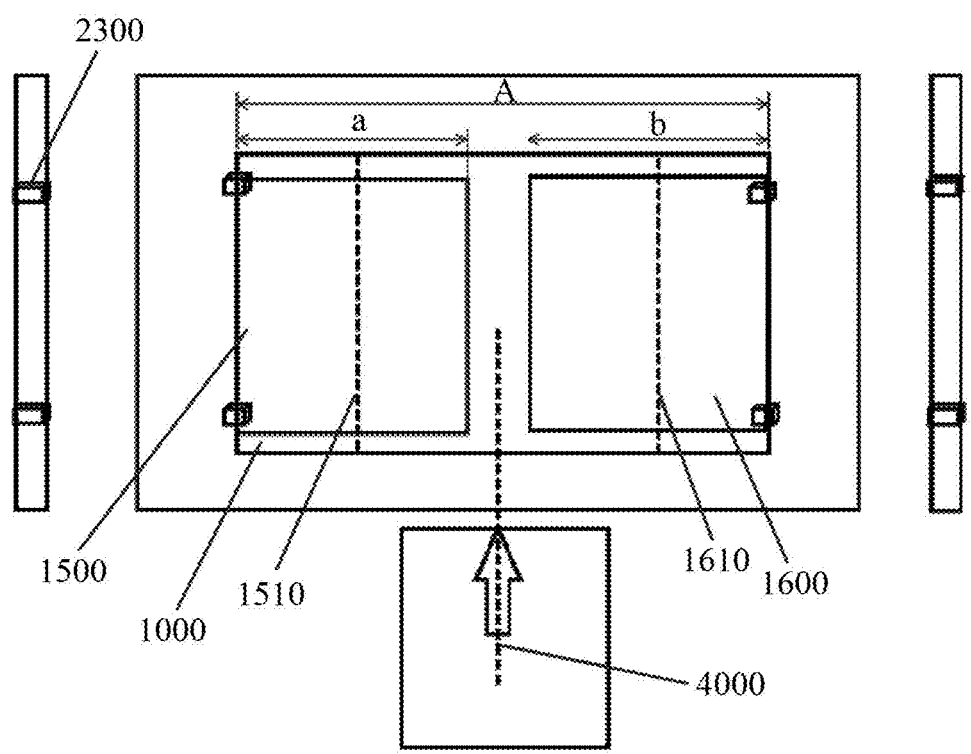
FIG. 9 is a schematic diagram of whole movement of a cassette according to one embodiment of the present disclosure.

A moving principle of the rotating member 2210 is as illustrated in FIG. 9, the width of the cassette is A, the width (i.e., width of substrates loaded in a sub-cassette) of a first sub-cassette 1500 is a, and the width (i.e., width of substrates loaded in a sub-cassette) of a second sub-cassette 1600 is b. When substrates need to be loaded in the first sub-cassette 1500, the first sub-cassette 1500 is moved rightwards by a distance of (A−a)/2 through the fourth drive 2330 so as to enable a first sub-cassette center line 1510 to coincide with the substrate placing center line 4000 for a mechanical arm, magnetic adsorption between the second sliding members 2212 and the second guide rails 2310 is restored to ensure the cassette to be more stable after the two center lines coincide with each other, and at the moment, substrates are loaded in the first sub-cassette 1500. In the same way, the second sub-cassette 1600 is moved leftwards by a distance of (A−b)/2, and a second sub-cassette center line 1610 coincides with the substrate placing center line 4000 for a mechanical arm, so that substrates are loaded in the second sub-cassette.

When widths of loaded substrates are smaller than one fourth of a width of a cassette and lengths of the substrates are smaller than one fourth of a length of the cassette, at least four regions in the cassette can be configured to load substrates, i.e., two sub-cassettes a and b on the front side and sub-cassettes c and d on the rear side. When the sub-cassettes a and b on the front side are fully loaded with substrates, the rotating unit drives the cassette to move to enable the cassette center line to coincide with the substrate placing center line 4000 for a mechanical arm, gravity of the integral cassette falls on the rotating axis at the moment, the rotating axis ascends to jack up the rotating unit, the rotating unit separates from the second sliding members, the rotating axis drives the rotating unit to rotate, the rotating unit drives the cassette to rotate by 180 degrees when the rotating axis rotates by 180 degrees, and at the moment, the sub-cassettes a and b fully loaded with substrates rotate to the rear side and the empty sub-cassettes c and d rotate to the front side to continue to load substrates.

Both leftward and rightward moving distances of the rotating member 2210 can be controlled by the second laser distance measuring devices 2400 disposed on the rotating member 2210 and the second frame 2100, thereby accuracy of movement of the sub-cassettes is achieved, and accuracy of movement of the sub-cassettes can be automatically adjusted after values are input by utilizing the operation interface through a designed program.

According to one embodiment of the present disclosure, the bearing device can be provided with an operation interface, the operation interface communicates with each action unit by controlling a program, and a series of actions described above can be implemented by the operation interface.

For example, adjustment on spaces of the sub-cassettes comprises operation steps as follows.

S1: placing the cassette provided by at least one embodiment of the present disclosure on the rotating member of the bearing device, and enabling four cylindrical supporting legs of the cassette to be nested on four hollow cylindrical connecting members on the rotating member.

S2: turning on a power supply switch of the operation interface, so that at the moment, circuits and signal transmission in the bearing device and the cassette are in a working state, bottoms of the first guide rails lose magnetism at the moment, magnetic adsorption between the first guide rails and the first sliding members is relieved, and the first sliding members are in a movable state.

S3: clicking on a setting key of the operation interface to carry out setting in spaces of the sub-cassettes in the cassette, at the moment, converting setting of the spaces of the sub-cassettes into setting of distances between the movable faces and surfaces, which are opposite to the movable faces, in the first frame, or setting of a distance between the movable faces, clicking on an enter key after inputting sizes of substrates to be loaded, at the moment, enabling the first drives to drive the first driving rods to rotate by the designed program, and controlling moving distances of the first sliding members by the rotating circle numbers of the first driving rods, for example, in the step, four first sliding members and the sliding rods on each movable face need to move simultaneously so as to guarantee stability in the moving process of the movable faces.

S4: when the moving distance of the first sliding members reaches to a preset distance, clicking on a setting completion key on the operation interface, so that at the moment, magnetism is generated at bottoms of the first guide rails due to the power-off operation, the first guide rails and the first sliding members are adsorbed by magnetism to fix the movable faces, the spaces of sub-cassettes are fixed at the moment, and substrates can be normally loaded.

When the spaces of the sub-cassettes are smaller than one fourth of the space of the cassette, a fifth step of operation can be carried out to rotate the cassette by 180 degrees.

S5: clicking on a cassette rotating key, and driving the rotating axis to rotate by 180 degrees by a driving device so as to drive the cassette to rotate by 180 degrees, so that at the moment, the sub-cassettes fully loaded with substrates rotate to the rear side, and the empty sub-cassettes rotate to the front side to continue to load substrates.

S6: after the spaces of the sub-cassettes are fully loaded with substrates, completing loading in the cassette, and after clicking on a loading completion key, removing the cassette out of the bearing device to complete loading in one cassette.

Then, a second cassette is placed in the bearing device to sequentially carry out operations according to the steps, so that substrate loading process can be completed.

The steps are manually set operations, and in order to save time, parameters of sub-cassettes are set on a program according to sizes of substrates to be loaded and all the steps can be automatically completed under the control of the program.

The cassette provided by at least one embodiment of the present disclosure has at least one of advantageous effects as follows.

(1) The movable face and the first frame are fixed by magnetism, and thus, the adjusted movable face can be firmly fixed on the first frame and breakage of glass substrates cannot be caused by movement generated due to unfirm fixation of the movable faces. The problem that a sub-cassette cannot be firmly fixed after adjustment in usual technique can be solved.

(2) The movable face(s) and/or the first frame can be combined according to sizes of substrates to bear glass substrates, and thus, the space of the cassette is sufficiently utilized.

(3) The first sliding member and the first guide rail are made of magnetic materials, and furthermore, the first sliding member and the first guide rail select sucker type de-energized electromagnet, so that when powered on, magnetic adsorption force between the first sliding member and the first guide rail disappear and the first sliding member can move freely, and when powered off, the magnetic adsorption force is generated between the first sliding member and the first guide rail, and thus, change of sizes of sub-cassettes can be automatically controlled by power-on and power-off operations. The problem that adjustment accuracy of a sub-cassette is difficult to determine in usual technique can be solved. And (4) In the case that first laser distance measuring device(s) is/are disposed, automatic and accurate control on moving distance is achieved by the first laser distance measuring device, the operation interface and the program designed by a computer, thereby sizes of sub-cassettes can be accurately controlled.

The substrate transfer device provided by at least one embodiment of the present disclosure has at least one of advantageous effects as follows:

(1) Under the drive of the bearing device in the substrate transfer device, the cassette is enabled to rotate by different angles, for example, the cassette can rotate by 180 degrees, so that the number of applicable sub-cassettes is increased. The problem that in usual technique, a cassette cannot automatically rotate, so that a space of the sub-cassette(s) cannot be sufficiently utilized can be solved.

(2) In the case that the second guide rail, the second driving rod and the second sliding member are disposed in the bearing device, the cassette can be driven to move left and right, and in the case that the second laser distance measuring device(s) is/are disposed on the second frame and/or on the cassette, accurate movement can be performed to enable the sub-cassette center lines to coincide with the substrate placing center line for a mechanical arm so as to accurately determine placement positions of the substrates. The problem that a cassette cannot be moved and a moving distance cannot be accurately measured so that a substrate cannot be accurately placed can be solved.

What have been described above are only specific implementations of the present disclosure, the protection scope of the present disclosure is not limited thereto. Any changes or substitutions easily occur to those skilled in the art within the technical scope of the present disclosure should be covered in the protection scope of the present disclosure. Therefore, the protection scope of the present disclosure should be based on the protection scope of the claims.

This application claims the benefit of priority from Chinese patent application No. 201510160948.8, filed on Apr. 7, 2015, the disclosure of which is incorporated herein in its entirety by reference as a part of the present application.

What is claimed is:

1. A cassette, comprising:
a first frame comprising at least one set of first guide rails; and
at least one movable face disposed in the first frame, wherein the movable face is configured to be capable of being driven to slide along the first guide rails, and is configured to be capable of being fixed on the first frame,
wherein the first frame comprises:
a face opposite to the movable face; and
first support rods disposed on the face opposite to the movable face, wherein the first support rods are perpendicular to the face opposite to the movable face and point to the inside of the first frame,
wherein a movable connecting rod is disposed on the movable face, and second support rods are disposed on the movable connecting rod, wherein the second support rods are parallel to the first support rods and point to the face opposite to the movable face, and wherein the movable connecting rod is configured to move in a direction perpendicular to the first guide rails to drive the second support rods to move.

2. The cassette according to claim 1, wherein the first frame comprises two sets of first guide rails, the two sets of first guide rails are parallel to each other and are respectively disposed on two opposite surfaces of the first frame, and wherein a first driving rod is disposed in each of the first guide rails in an extending direction of the first guide rails.

3. The cassette according to claim 2, wherein the first frame is a parallelepiped frame, and wherein the two sets of first guide rails are disposed at four sides parallel to each other of the first frame.

4. The cassette according to claim 2, wherein the movable face is disposed in the first frame and is connected with the two sets of first guide rails and perpendicular to the extending direction of the first guide rails;
  a sliding rod is disposed on the movable face along its side crossed with and perpendicular to the first guide rails; and
  a first sliding member capable of being nested on the first driving rod is disposed on the sliding rod.

5. The cassette according to claim 4, wherein the first sliding member is connected with the first driving rod by screw threads.

6. The cassette according to claim 4, wherein the first sliding member and one of the first guide rails are magnetically adsorbed, and, during desorption, the first sliding member drives the sliding rod and the sliding rod drives the movable face to move, so that an inside of the first frame is divided into sub-cassettes with different sizes.

7. The cassette according to claim 6, wherein the first sliding member and the first guide rails are made of a sucker type de-energized electromagnet.

8. The cassette according to claim 1, wherein a support pillar with via holes is disposed on the movable face, the movable connecting rod is disposed on the support pillar, and the via holes are opposite to the first support rods.

9. The cassette according to claim 1, wherein a first laser distance measuring device configured to measure a moving distance of the movable face is disposed on at least one of the first frame and the movable face.

10. The cassette according to claim 1, wherein a supporting leg configured to mount a first chip is disposed at a bottom of the cassette.

11. A substrate transfer device comprising the cassette according to claim 1 and a bearing device configured to bear the cassette, wherein the bearing device comprises a second frame and a rotating unit mounted in the second frame, and the rotating unit comprises a rotating member, and a rotating axis which is disposed at a center of the rotating member and is configured to drive the rotating member to rotate.

12. The substrate transfer device according to claim 11, wherein a supporting leg configured to mount a first chip is disposed at a bottom of the cassette, and the rotating unit further comprises a connecting member which is disposed on the rotating member and is configured to be nested with the supporting leg of the cassette.

13. The substrate transfer device according to claim 12, wherein a second chip is disposed in the connecting member.

14. The substrate transfer device according to claim 11, wherein a base configured to mount the rotating unit is disposed at a bottom of the second frame, a second guide rail is disposed on the base, and a second driving rod is disposed in the second guide rail in an extending direction of the second guide rail, and wherein a second sliding member matched with the second driving rod is disposed at a bottom of the rotating member, and the second sliding member is configured to be capable of sliding on the second driving rod to drive the rotating member to slide along the second guide rail.

15. The substrate transfer device according to claim 14, wherein the second sliding member and the second guide rail are made of a sucker type de-energized electromagnet.

16. The substrate transfer device according to claim 14, wherein a second laser distance measuring device configured to measure a distance between the second frame and the rotating unit is disposed on at least one of the second frame and the rotating unit.

17. The substrate transfer device according to claim 11, wherein the second frame is a parallelepiped frame.

* * * * *